(12) United States Patent
Tanaka et al.

(10) Patent No.: US 9,945,908 B2
(45) Date of Patent: Apr. 17, 2018

(54) ACTUATOR FAULT DETECTION DEVICE, CONTROLLING DEVICE AND CONTROL METHOD

(71) Applicant: Azbil Corporation, Tokyo (JP)

(72) Inventors: Masato Tanaka, Tokyo (JP); Fumihiro Sugawara, Tokyo (JP); Tomohiko Aikawa, Tokyo (JP)

(73) Assignee: Azbil Corporation, Tokyo (JP)

( * ) Notice: Subject to any disclaimer, the term of this patent is extended or adjusted under 35 U.S.C. 154(b) by 151 days.

(21) Appl. No.: 15/223,397

(22) Filed: Jul. 29, 2016

(65) Prior Publication Data

US 2017/0030972 A1    Feb. 2, 2017

(30) Foreign Application Priority Data

Jul. 30, 2015  (JP) ................................. 2015-150495

(51) Int. Cl.
 *G01R 31/34* (2006.01)
 *F27D 21/04* (2006.01)

(52) U.S. Cl.
 CPC ............. *G01R 31/34* (2013.01); *F27D 21/04* (2013.01)

(58) Field of Classification Search
 CPC ................. F27D 21/04; F02D 2250/21; F02D 2200/0802
 See application file for complete search history.

(56) References Cited

U.S. PATENT DOCUMENTS 7,970,583 B2   6/2011  Novis et al.
2008/0318726 A1* 12/2008 Matsubara ............. B60K 6/365
477/3

(Continued)

FOREIGN PATENT DOCUMENTS

EP    2 075 474 B1   2/2014
JP    H07-269505 A   10/1995

(Continued)

OTHER PUBLICATIONS

Taiwan Intellectual Property Office, "Office Action," issued in TW Patent Application No. 105117794, which is a TW counterpart of U.S. Appl. No. 15/223,397, dated May 1, 2017, 7 pages (2 pages of English Translation of Office Action and 5 pages of Office Action).

(Continued)

*Primary Examiner* — Giovanni Astacio-Oquendo
*Assistant Examiner* — Alvaro Fortich
(74) *Attorney, Agent, or Firm* — Amster, Rothstein & Ebenstein LLP (57) ABSTRACT

An actuator fault detection device that detects a fault of an actuator driven according to a manipulation variable MV output from a controlling device, including: a position acquiring portion that acquires a value of a motor position MP from a detector that detects a position of an actuator corresponding to a manipulation variable MV; a follow-up difference calculating portion that calculates a follow-up difference DM=MV−MP; and an allowable range determining portion that determines whether or not high speed operation or low speed operation of the actuator departs from an allowable range based on a manipulation variable change rate ΔMV, an actuator position change rate ΔMP, and the follow-up difference DM.

16 Claims, 4 Drawing Sheets

(56) References Cited

U.S. PATENT DOCUMENTS

2009/0322262 A1* 12/2009 Tobari ................. H02P 21/18
    318/400.02
2010/0259208 A1* 10/2010 Hao ................. H02K 21/028
    318/538

FOREIGN PATENT DOCUMENTS

| JP | 2010-146331 A | 7/2010 |
|----|---------------|--------|
| JP | 2011-015509 A | 1/2011 |

OTHER PUBLICATIONS

Japanese Application No. JP2015-150495, filed Jul. 30, 2015.

* cited by examiner

Fig. 5

ACTUATOR FAULT DETECTION DEVICE, CONTROLLING DEVICE AND CONTROL METHOD

CROSS-REFERENCE TO RELATED APPLICATION

The present application claims the benefit of and priority to Japanese Patent Application No. 2015-150495, filed on Jul. 30, 2015, the entire contents of which are incorporated by reference herein.

TECHNICAL FIELD

The present invention relates to an actuator fault detection device capable of detecting or predicting a fault of an actuator such as a motor or a valve, and a controlling device having the actuator fault detection device.

BACKGROUND ART

A hybrid heat treatment furnace including a gas combustion furnace and an electric furnace has been developed for the purpose of satisfying as much as possible the requirements of energy saving and high precision control. The hybrid heat treatment furnace operates as follows.

(I) The hybrid heat treatment furnace operates the energetically favorable gas combustion furnace when raising a temperature from a lower temperature to a higher temperature.

(II) The hybrid heat treatment furnace operates the more responsive electric furnace when maintaining a constant temperature with high precision after raising the temperature.

Figure 5:
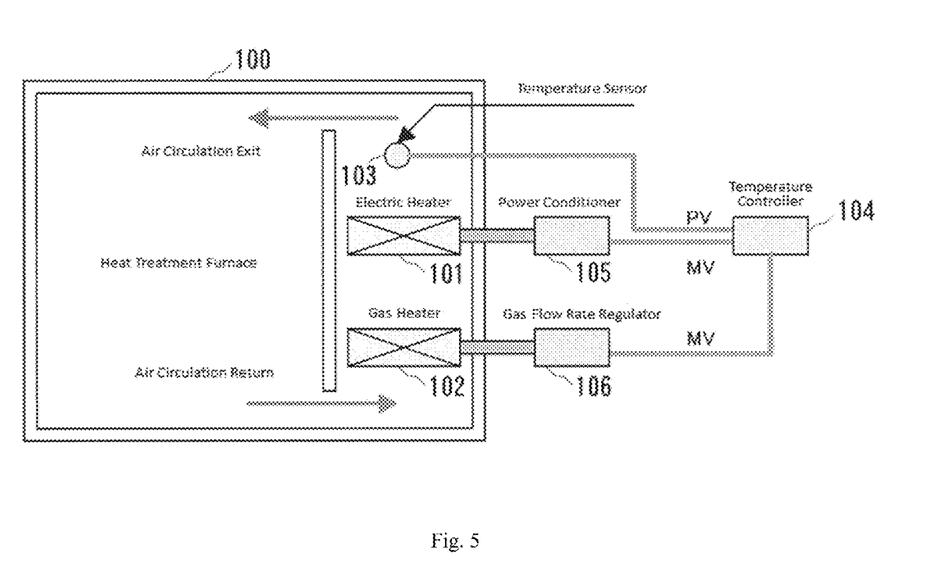
FIG. 5 is a diagram illustrating an example of a temperature control system in a hybrid heat treatment furnace.

FIG. 5 is a diagram illustrating an example of a temperature control system in a hybrid heat treatment furnace. In the example of FIG. 5, an electric heater 101, a gas heater 102, and a temperature sensor 103 are installed inside a heat treatment furnace 100. The temperature sensor 103 measures a temperature PV (process variable) of an air heated by the electric heater 101 or the gas heater 102. A temperature controller 104 calculates a manipulation variable MV so that the temperature PV matches a setting value SP. A power conditioner 105 supplies an electric power corresponding to the manipulation variable MV to the electric heater 101. A gas flow rate regulator 106 supplies a gas at a flow rate corresponding to the manipulation variable MV to the gas heater 102. The temperature controller 104 controls a temperature in the heat treatment furnace 100.

As described above, when raising the temperature of the heat treatment furnace 100 from a lower temperature to a higher temperature, the hybrid heat treatment furnace operates the energetically favorable gas combustion furnace with the use of the gas flow rate regulator 106 and the gas heater 102. On the other hand, when maintaining the temperature of the heat treatment furnace 100 at a constant value with high precision after raising the temperature, the hybrid heat treatment furnace operates the more responsive electric furnace with the use of the power conditioner 105 and the electric heater 101 although the electric furnace is inferior to the gas combustion furnace in terms of energy efficiency.

PTL 1 has proposed a controlling device which switches from a gas mode to an electric mode quickly and surely in the hybrid heat treatment furnace described above.

In addition to the hybrid heat treatment furnace, various improvements to the temperature control system of a combustion based furnace have been tested. In a temperature control system for a combustion based furnace, in order to control the temperature the flow rate of a fuel such as gas has to be controlled. For example, a control valve capable of adjusting the flow rate is employed as the gas flow rate regulator. A motor position for operating the valve is represented by the manipulation variable MV that is an output of a proportional integral derivative (PID) calculation.

However, since the motor is constrained by a movable body whose operating speed is limited, the motor position does not always actually follow the manipulation variable MV calculated by the PID calculation. In contrast, in an electric heater, an electric current value follows the manipulation variable MV without substantial delay. Therefore, in order to confirm that the motor position follows the manipulation variable MV, a motor feedback value MFB is incorporated into a controller. Although the manipulation variable MV and the motor feedback value MFB are theoretically the same physical quantity, the manipulation variable MV and the motor feedback value MFB are distinguished from each other in monitoring assuming that the manipulation variable MV and the motor feedback value MFB do not match each other.

Further, without being limited to a temperature control system, the use of feedback can be applied in other systems. In a control valve (see PTL 2) used in the flow rate control system in a petrochemical plant, likewise, in order to confirm that a valve stem position follows the manipulation variable MV, a position feedback may be incorporated into a controller.

CITATION LIST

Patent Literature

[PTL 1] JP-A-2010-146331
[PTL 2] JP-A-1995(Hei-7)-269505

SUMMARY OF THE INVENTION

Problem that the Invention is to Solve

As described above, since the motor and the valve are mechanical movable bodies, they are control system components in which a fault is likely to occur. As compared with at least the electric heater in a normal electric furnace, they must be considered as components in which a fault is likely to occur, including a catastrophic fault. In addition, there are systems that are less fault tolerant, including for example, a temperature control system that manages high temperatures, such as one in a gas combustion furnace. Further examples include a flow rate control system that manages a fluid having flammability and toxicity, such as one in a petrochemical plant. Therefore, an upgrade and improvement of the fault detection in safety have been demanded.

The present invention has been made to solve the above problems, and therefore an object of the present invention is to provide an actuator fault detection device, a controlling device, and a control method which are capable of improving a fault detection and fault prediction function of a mechanical movable actuator such as a motor used in a temperature control system due to combustion or a valve used in a flow rate control system.

Means for Solving the Problem

According to an embodiment of the present invention, an actuator fault detection device that detects a fault of an actuator driven according to a manipulation variable MV output from a controlling device includes: a position acquiring portion configured to acquire a value of an actuator position MP from a position detection and feedback mechanism configured to detect a position of an actuator corresponding to a manipulation variable MV; a follow-up difference calculating portion configured to calculate a follow-up difference DM=MV−MP between the manipulation variable MV and the actuator position MP; and an allowable range determining portion configured to determine whether high speed operation of the actuator departs from an allowable range based on a change rate ΔMP of the actuator position MP and the follow-up difference DM.

In one embodiment of the actuator fault detection device according to the present invention, the allowable range determining portion determines that an abnormality occurs in the actuator when an absolute value |ΔMP| of the observed actuator position change rate ΔMP falls outside a range of DPH−α (α is a specified value) from an upper limit DPH in a situation where an absolute value |DM| of the follow-up difference DM is larger than the upper limit DPH of the absolute value |ΔMP| of the actuator position change rate ΔMP.

According to an embodiment of the present invention, the actuator fault detection device includes: a position acquiring portion configured to acquire a value of an actuator position MP from a position detection and feedback mechanism configured to detect a position of an actuator corresponding to a manipulation variable MV; a follow-up difference calculating portion configured to calculate a follow-up difference DM=MV−MP between the manipulation variable MV and the actuator position MP; and an allowable range determining portion configured to determine whether low speed operation of the actuator departs from an allowable range based on a change rate ΔMV of the manipulation variable MV, a change rate ΔMP of the actuator position MP, and the follow-up difference DM.

In another embodiment of the actuator fault detection device according to the present invention, the allowable range determining portion determines that an abnormality occurs in the actuator when an absolute value |ΔMP| of the observed actuator position change rate ΔMP falls outside a range of |ΔMV|−β (β is a specified value) from an absolute value |ΔMV| of the manipulation variable change rate ΔMV in a situation where the follow-up difference DM is substantially 0, and the absolute value |ΔMV| of a next manipulation variable change rate ΔMV is smaller than an upper limit DPH of the absolute value |ΔMP| of the actuator position change rate ΔMP.

In another embodiment of the actuator fault detection device according to the present invention, the actuator is a motor.

According to an embodiment of the present invention, a controlling device includes a manipulation variable calculating portion configured to calculate a manipulation variable MV based on a setting value SP and a controlled variable PV to output the manipulation variable MV to an operating portion of an actuator; and an actuator fault detection device.

According to an embodiment of the present invention, an actuator fault detection method for detecting a fault of an actuator driven according to a manipulation variable MV output from a controlling device includes: a position acquiring step of acquiring a value of an actuator position MP from a position detection and feedback mechanism for detecting a position of the actuator corresponding to the manipulation variable MV; a follow-up difference calculating step of calculating a follow-up difference DM=MV−MP between the manipulation variable MV and the actuator position MP; and an allowable range determining step of determining whether high speed operation of the actuator departs from an allowable range, or not, on the basis of a change rate ΔMP of the actuator position MP and the follow-up difference DM.

According to an embodiment of the present invention, an actuator fault detection method includes: a position acquiring step of acquiring a value of an actuator position MP from a position detection and feedback mechanism for detecting a position of an actuator corresponding to a manipulation variable MV; a follow-up difference calculating step of calculating a follow-up difference DM=MV−MP between the manipulation variable MV and the actuator position MP; and an allowable range determining step of determining whether low speed operation of the actuator departs from an allowable range, or not, on the basis of a change rate ΔMV of the manipulation variable MV, a change rate ΔMP of the actuator position MP, and the follow-up difference DM.

According to an embodiment of the present invention, a control method includes a manipulation variable calculating step of calculating a manipulation variable MV based on a setting value SP and a controlled variable PV to output the manipulation variable MV to an operating portion of the actuator; the position acquiring step, the follow-up difference calculating step, and the allowable range determining step.

Advantage of the Invention

According to an embodiment of the present invention, the value of the actuator position MP is acquired from the position detection and feedback mechanism, and the follow-up difference DM between the manipulation variable MV and the actuator position MP is calculated. It is determined whether the high speed operation of the actuator departs from the allowable range based on the change rate ΔMP of the actuator position MP and the follow-up difference DM, thereby being capable of detecting or predicting the fault of the actuator with accuracy higher than that of the conventional art.

Further, according to an embodiment of the present invention, the value of the actuator position MP is acquired from the position detection and feedback mechanism, and the follow-up difference DM between the manipulation variable MV and the actuator position MP is calculated. It is determined whether the low speed operation of the actuator departs from the allowable range based on the change rate ΔMV of the manipulation variable MV, the change rate ΔMP of the actuator position MP and the follow-up difference DM, thereby being capable of detecting or predicting the fault of the actuator with accuracy higher than that of the conventional art.

MODE FOR CARRYING OUT THE INVENTION

[Principle of the Invention]

In a temperature control system or a flow rate control system using a PID calculation, a nature specific to the control system is reflected in a manipulation variable MV which is utilized by the PID calculation. Therefore, the present inventors have recognized the fact that, for example, in a motor that normally follows the manipulation variable MV, abnormality (fault) can be detected with higher accuracy by monitoring a motor feedback value MFB (motor position MP) and taking a nature of the motor into account.

Specifically, there is a case in which a manipulation variable change rate ΔMV and an motor position change rate ΔMP corresponding to motor where a follow-up difference DM=MV−MP in a transient state departs from an allowable range. In other words, a case in which operation higher in speed (or higher in frequency) than the expected high speed operation (or high frequency operation) of the manipulation variable MV is observed in the motor feedback value MFB, or a case in which operation much lower in speed (or lower in frequency) than the expected low speed operation (or low frequency operation) of the manipulation variable MV is observed in the motor feedback value MFB is available as the abnormal operation index (fault operation index) of the motor. The same principle can be also applied to other actuators such as a valve.

Embodiment

Figure 1:
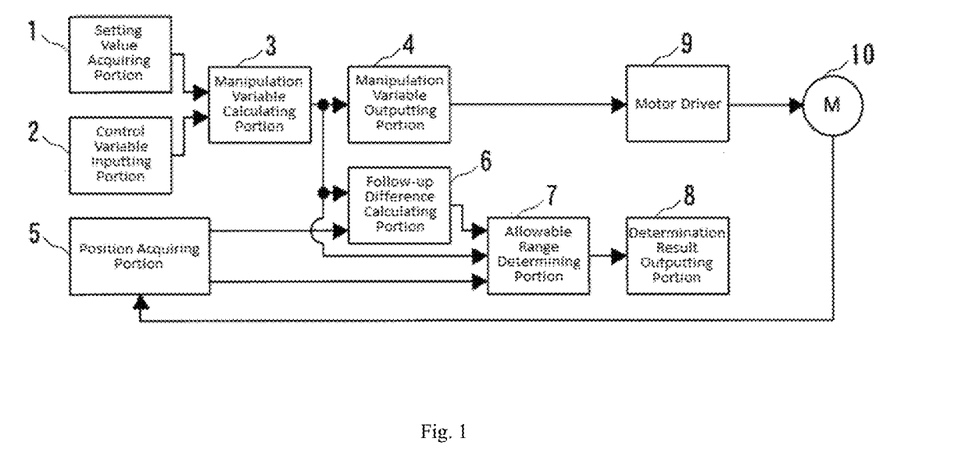
FIG. 1 is a block diagram illustrating a configuration of a controlling device according to an embodiment of the present invention.

FIG. 1 is a block diagram illustrating a configuration of a controlling device according to an embodiment of the present invention. In this embodiment, a fault detection system for a motor for operating a control valve of a gas flow rate regulator for controlling a flow rate of a fuel in a temperature control system for combustion based furnace is presented.

A controlling device includes a setting value acquiring portion 1, a control variable inputting portion 2 that receives a controlled variable PV from a measuring instrument, a manipulation variable calculating portion 3 that calculates a manipulation variable MV based on a setting value SP and the controlled variable PV through a PID control operation, and a manipulation variable outputting portion 4 that outputs the manipulation variable MV to a motor driver 9. The controlling device also includes a position acquiring portion 5 that acquires a value of a motor position MP from an encoder for detecting a position of a motor 10 corresponding to the manipulation variable MV, and a follow-up difference calculating portion 6 that calculates a follow-up difference DM between the manipulation variable MV and the motor position MP. The controlling device further includes an allowable range determining portion 7 that determines whether high speed operation or low speed operation of the motor 10 departs from an allowable range based on a change rate ΔMV of the manipulation variable MV, a change rate ΔMP of the motor position MP, and the follow-up difference DM, and a determination result outputting portion 8 that outputs a determination result of the allowable range determining portion 7.

Figure 2:
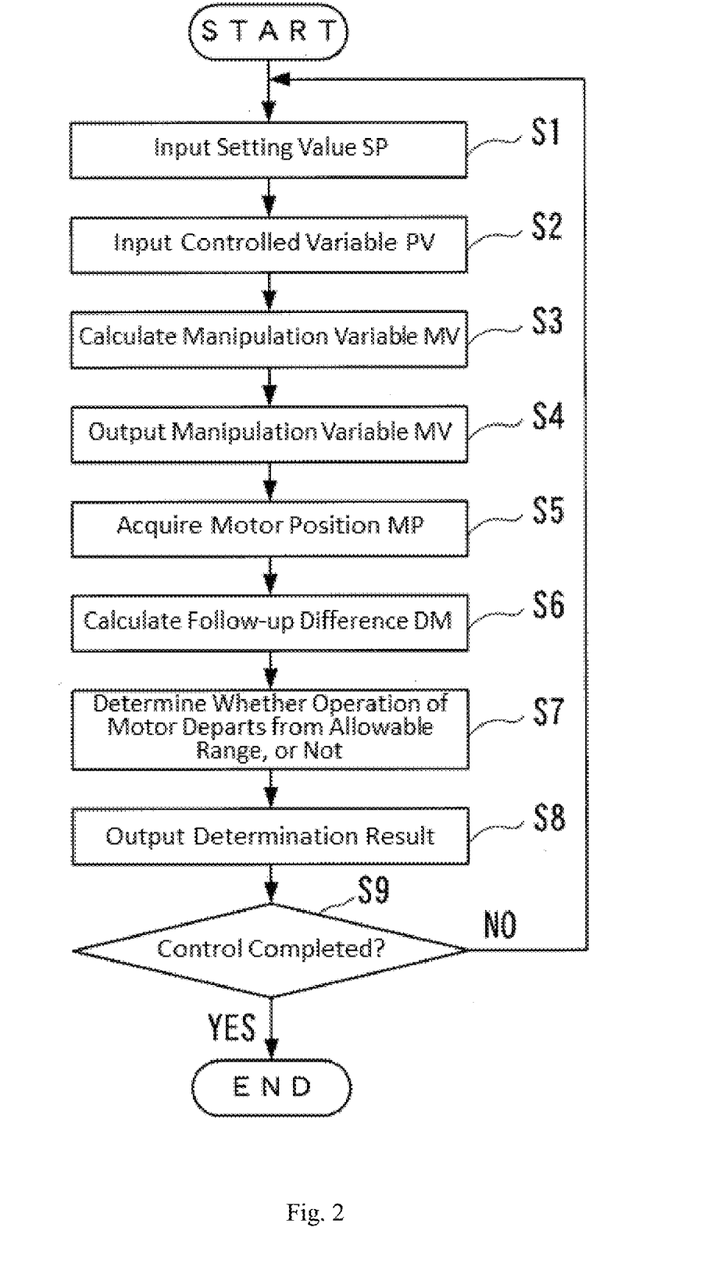
FIG. 2 is a flowchart illustrating the operation of the controlling device according to an embodiment of the present invention.

Hereinafter, the operation of the controlling device according to the present embodiment will be described. FIG. 2 is a flowchart illustrating the operation of the controlling device.

The setting value SP (desired temperature setting value in the case of a temperature control system) is set by an operator of the controlling device, and input to the manipulation variable calculating portion 3 through the setting value acquiring portion 1 (Step S1 in FIG. 2).

The controlled variable PV (measured temperature value in a temperature control system) is measured by a measuring instrument (for example, a temperature sensor for measuring a temperature of an object to be heated)(not shown), and input to the manipulation variable calculating portion 3 through the control variable inputting portion 2 (Step S2 in FIG. 2).

The manipulation variable calculating portion 3 calculates the manipulation variable MV based on the setting value SP and the controlled variable PV through a known PID control operation (Step S3 in FIG. 2).

The manipulation variable outputting portion 4 outputs the manipulation variable MV calculated by the manipulation variable calculating portion 3 to the object to be controlled (Step S4 in FIG. 2). In this example, an actual output destination of the manipulation variable MV is the motor driver 9 (operating portion). The motor driver 9 controls the motor 10 so that the motor position follows the manipulation variable MV that is inputted.

The position acquiring portion 5 acquires a value of the motor position MP indicative of a rotation angle position of the motor 10 from an encoder (not shown) which is a position detection and feedback mechanism provided in the motor 10 due to a function of a normal motor feedback MFB (Step S5 in FIG. 2). In the present embodiment, the motor 10 is rotated to a rotation angle position corresponding to the manipulation variable MV in an angle range less than one revolution, an encoder detects the rotation angle position of the motor 10, and the detected rotation angle position is expressed as the motor position MP with the use of a value ranging from 0 to 100%. Therefore, if the motor 10 correctly follows the manipulation variable MV, the manipulation variable MV matches the value of the motor position MP after a delay period (a delay period which is determined according to a motor and a control system of the motor is a time shorter than a control cycle dT to be described later) has elapsed from an output of the manipulation variable MV.

Then, the follow-up difference calculating portion 6 calculates the follow-up difference DM between the manipulation variable MV and the motor position MP as represented by the following expression (Step S6 in FIG. 2).

$$DM = MV - MP \quad (1)$$

The allowable range determining portion 7 determines whether or not the high speed (high frequency) operation of the motor 10 departs from an allowable range and whether or not the low speed (low frequency) operation of the motor 10 departs from an allowable range based on the manipulation variable change rate ΔMV, the motor position change rate ΔMP, and the follow-up difference DM (Step S7 in FIG. 2).

Figure 3:
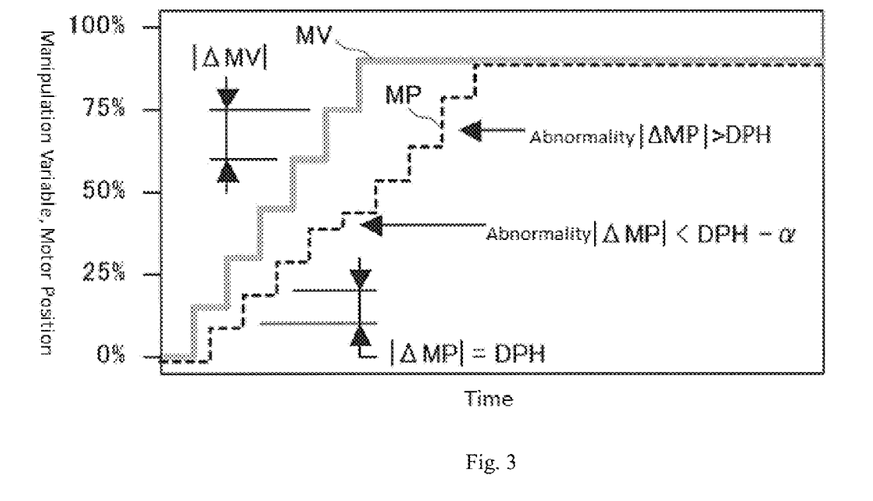
FIG. 3 is a diagram illustrating one operation of the allowable range determining portion according to an embodiment of the present invention.

A typical example will be described below. FIG. 3 is a diagram illustrating the operation of the allowable range determining portion 7. In particular, it illustrates an example of change in the manipulation variable MV and the motor position MP when an abnormality occurs in the motor 10. An absolute value |ΔMP| of the change rate ΔMP of the motor position MP has an upper limit DPH predetermined by a performance of the motor 10, and when an absolute value |DM| of the follow-up difference DM is larger than the upper limit DPH (a situation resulting from a high speed (high frequency) change in the change rate ΔMV of the manipulation variable MV), the absolute value |ΔMP| of the motor position change rate ΔMP to be next observed substantially matches the upper limit DPH.

Therefore, the allowable range determining portion 7 determines that an abnormality occurs in the motor 10 unless the absolute value |ΔMP| of the motor position change rate ΔMP observed in a situation where the absolute value |DM| of the follow-up difference DM is larger than the upper limit DPH falls within a range of DPH−α from the upper limit DPH (Step S7).

IF |DM(t−1)|>DPH AND |ΔMP(t)|<DPH−α THEN ABNORMALITY OCCURRENCE (2)

IF |DM(t−1)|>DPH AND |ΔMP(t)|>DPH THEN ABNORMALITY OCCURRENCE (3)

Symbol α is a predefined minuscule value (α<DPH). Since the motor position change rate ΔMP is an actual measurement value for the operation of a mechanical mechanism, it is preferable to take a minuscule error different from the abnormality such as a rotation shortage error of a rotor in a motor into account, and α is defined according to an estimation of the minuscule error. Since the controlling device operates in the control cycle dT, when a situation in which an absolute value |DM(t−1)| of a follow-up difference DM(t−1) at a time (t−1) is larger than the upper limit DPH is observed, the absolute value |ΔMP| of the motor position change rate ΔMP is determined at timing from the time (t−1) to a time t after the control cycle dT, as an absolute value |ΔMP(t)| of a motor position change rate ΔMP(t) at the time t.

Figure 4:
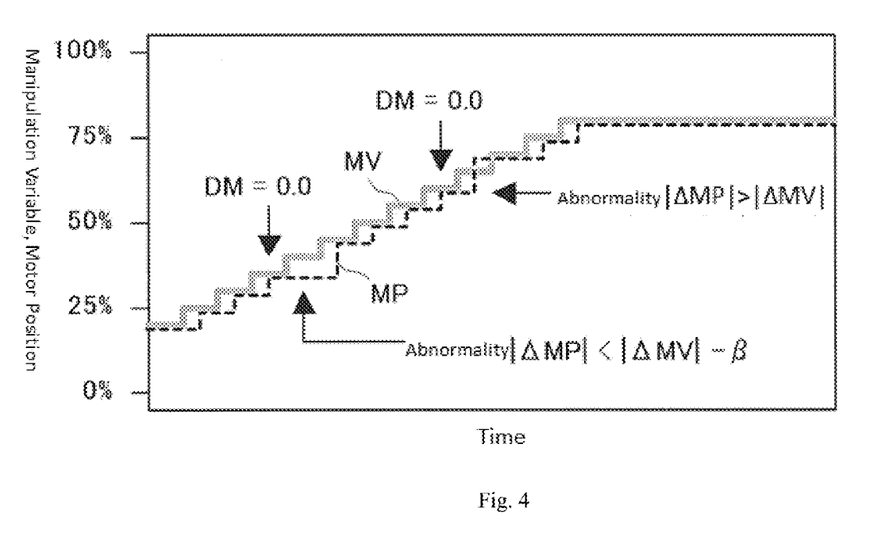
FIG. 4 is a diagram illustrating another operation of an allowable range determining portion according to an embodiment of the present invention.

Next, another typical example will be described. FIG. 4 is a diagram illustrating another operation of the allowable range determining portion 7. In particular, it illustrates another example of a change in the manipulation variable MV and the motor position MP when an abnormality occurs in the motor 10. When the follow-up difference DM is substantially 0, and the absolute value |ΔMV| of the manipulation variable change rate ΔMV to be next observed is smaller than the upper limit DPH (a situation in which a low speed (low frequency) change occurs in the manipulation variable change rate ΔMV), the absolute value |ΔMP| of the motor position change rate ΔMP to be further next observed substantially matches the absolute value |ΔMV| of the manipulation variable change rate ΔMV.

Therefore, the allowable range determining portion 7 determines that an abnormality occurs in the motor 10 if the follow-up difference DM is substantially 0, and the absolute value |ΔMP| of the motor position change rate ΔMP observed in a situation where the absolute value |ΔMV| of the manipulation variable change rate ΔMV is smaller than the upper limit DPH does not fall within a range of |ΔMV|−β from the absolute value |ΔMV| of the manipulation variable change rate ΔMV (Step S7).

IF DM(t−2)≈0.0 AND |ΔMV(t−1)|<DPH AND |ΔMP(t)|<|ΔMV(t−1)|−β THEN ABNORMALITY OCCURRENCE (4)

IF DM(t−2)≈0.0 AND |ΔMV(t−1)|<DPH AND |ΔMP(t)|>|ΔMV(t−1)| THEN ABNORMALITY OCCURRENCE (5)

Symbol β s a predefined minuscule value (β<|MV|). Since the motor position change rate ΔMP(t) is an actual measurement value for the operation of the mechanical mechanism, it is preferable to take a minuscule error different from the abnormality such as a rotation shortage error of the rotor in the motor into account, and β is defined according to an estimation of the minuscule error. That the follow-up difference DM is substantially 0 means that the follow-up difference DM falls within a predetermined range 0±γ (γ is a predefined minuscule value) centered on 0. Symbol γ may be defined in the same manner as that of α and β. As described above, since the controlling device operates in the control cycle dT, when a situation in which an absolute value |DM(t−2)| of a follow-up difference DM(t−2) at a time (t−2) is substantially 0 is observed, the absolute value |ΔMV| of the manipulation variable change rate ΔMV is determined at timing of the time (t−1) after the control cycle dT from the time (t−2), as an absolute value |ΔMV(t−1)| of the manipulation variable change rate ΔMV(t−1) at the time (t−1). Further, the absolute value |ΔMP| of the motor position change rate ΔMP is determined at timing of the time t after the control cycle dT from the time (t−1), as the absolute value |ΔMP(t)| of the motor position change rate ΔMP(t) at the time t.

The determination result outputting portion 8 outputs a determination result of the allowable range determining portion 7 (Step S8 in FIG. 2). As an output method in this case, there is, for example, a display of the determination result, or data of the determination result may be output to an external device. When Expression (2) to Expression (5) are not met, and it is determined that there is no abnormality in the motor 10, the determination result is not output, and an alarm may be output only when it is determined that the abnormality occurs in the motor 10. As an output method of the alarm, there are, for example, a method of displaying a message indicating the abnormality of the motor 10, and a method of blinking or turning on an alarm notification LED. The output function of the determination result described above can be effectively used as an alarm function for detecting or predicting the fault of the motor 10.

The controlling device executes the processing in Steps S1 to S8 of FIG. 2 for each control cycle dT until the control is completed, for example, according to an instruction from the operator (yes in Step S9 of FIG. 2).

In the present embodiment, a fault detection system for an actuator that is a motor has been described. However, the present invention is not limited to this configuration, but the present invention can be applied to other actuators, for example, a valve of a flow rate control system. When a pneumatically actuated valve is used as the actuator, an setting/operating portion that is an output destination of the manipulation variable MV configures an electric-pneumatic converter for converting the manipulation variable MV into an air pressure signal. When an electrically operated valve is used as the actuator, the setting/operating portion that is the output destination of the manipulation variable MV configures a motor driver of a motor for driving the valve.

If the "motor" described in FIGS. 1 and 2 is replaced with "actuator" or "valve", the configuration and the operation of the controlling device according to the present embodiment can be applied to the valve in the same manner. In other words, the valve (or positioner) is provided with a position detection and feedback mechanism that detects a valve opening position and feeding back the detected valve opening position. The valve is driven to move to the opening position corresponding to the manipulation variable MV, and the position detection and feedback mechanism detects the opening position of the valve, and the detected opening position is expressed as the actuator position MP with the use of a value of 0 to 100%. If the valve correctly follows the manipulation variable MV, the manipulation variable MV matches the value of the actuator position MP. If the valve correctly follows the manipulation variable MV, the manipulation variable MV matches the value of the actuator position MP after a delay period (a delay period which is determined according to a valve and a control system of the valve is a time shorter than the control cycle dT) has elapsed from the output of the manipulation variable MV. From the above description, it is apparent that the present invention can be applied to a valve.

The controlling device described according to the present embodiment can be realized by a computer having a CPU (central processing unit), a memory device, and an interface, and programs for controlling those hardware resources. The CPU executes the processing described in the present embodiment according to the programs stored in the memory device.

In addition, in the present embodiment, the actuator fault detection device including the position acquiring portion 5, the follow-up difference calculating portion 6, the allowable range determining portion 7, and the determination result outputting portion 8 is provided inside the controlling device. Alternatively, the actuator fault detection device may be provided outside of the controlling device. In that case, the CPU of the computer configuring the actuator fault detection device executes the processing described in the present embodiment according to the programs stored in the memory device of the computer.

INDUSTRIAL APPLICABILITY

The present invention can be applied to a technique for detecting or predicting the fault of the actuator.

DESCRIPTION OF REFERENCE NUMERALS AND SIGNS

1 . . . setting value acquiring portion, 2 . . . control variable inputting portion, 3 . . . manipulation variable calculating portion, 4 . . . manipulation variable outputting portion, 5 . . . position acquiring portion, 6 . . . follow-up difference calculating portion, 7 . . . allowable range determining portion, 8 . . . determination result outputting portion, 9 . . . motor driver, 10 . . . motor.

The invention claimed is:

1. An actuator fault detection device that detects a fault of an actuator driven according to a manipulation variable (MV) output from a controlling device, comprising:
a position acquiring portion that acquires an actuator position value (MP) from a position detection and feedback mechanism of the actuator that detects a position of the actuator corresponding to the manipulation variable MV;
a follow-up difference calculating portion configured to calculate a follow-up difference (DM=MV−MP); and
an allowable range determining portion configured to determine whether high speed operation of the actuator departs from an allowable range based on an actuator position change rate ΔMP and the follow-up difference DM,
wherein the controlling device controls a rotation of the actuator by outputting the manipulation variable MV to the actuator; and
wherein the actuator rotates to a rotation angle position in accordance with the manipulation variable MV outputted from the controlling device.

2. The actuator fault detection device according to claim 1, wherein
the allowable range determining portion determines that an abnormality occurs in the actuator when an absolute value |ΔMP| of the actuator position change rate ΔMP is less than DPH-α and an absolute value |DM| of the follow-up difference DM is larger than DPH, wherein DPH is a value corresponding to an absolute value of a maximum position change rate of the actuator and α is a predefined value.

3. The actuator fault detection device according to claim 2, wherein the actuator includes a motor.

4. The actuator fault detection device according to claim 2, wherein the controlling device comprises: a manipulation variable calculating portion configured to calculate the manipulation variable MV based on a setting value SP and a controlled variable PV and to output the manipulation variable MV to an operating portion of the actuator.

5. An actuator fault detection device that detects a fault of an actuator driven according to a manipulation variable (MV) output from a controlling device, comprising:
a position acquiring portion that acquires an actuator position value (MP) from a position detection and feedback mechanism of the actuator that detects a position of the actuator corresponding to the manipulation variable MV;
a follow-up difference calculating portion configured to calculate a follow-up difference (DM=MV−MP); and
an allowable range determining portion configured to determine whether low speed operation of the actuator departs from an allowable range based on a manipulation variable change rate ΔMV, an actuator position change rate ΔMP, and the follow-up difference DM,
wherein the controlling device controls a rotation of the actuator by outputting the manipulation variable MV to the actuator; and
wherein the actuator rotates to a rotation angle position in accordance with the manipulation variable MV outputted from the controlling device.

6. The actuator fault detection device according to claim 5, wherein
the allowable range determining portion determines that an abnormality occurs in the actuator when an absolute value |ΔMP| of the actuator position change rate ΔMP is less than |ΔMV(t0)|−β, the follow-up difference DM is substantially 0, and |ΔMV(t1)| is less than DPH, wherein DPH is a value corresponding to an absolute value of a maximum position change rate of the actuator, β is a predefined value, |ΔMV(t0)| is an absolute value of the manipulation variable change rate at time t0 and |ΔMV(t1)| is an absolute value of the manipulation variable change rate at time t1.

7. The actuator fault detection device according to claim 6, wherein the actuator includes a motor.

8. The actuator fault detection device according to claim 6, wherein the controlling device comprises:
a manipulation variable calculating portion configured to calculate the manipulation variable MV based on a setting value SP and a controlled variable PV and to output the manipulation variable MV to an operating portion of the actuator.

9. A method for detecting a fault of an actuator driven according to a manipulation variable (MV) output from a controlling device comprising the steps of:
acquiring a value of an actuator position (MP) from a position detection and feedback mechanism of the actuator that detects a position of the actuator corresponding to the manipulation variable MV;

calculating a follow-up difference (DM=MV−MP); and determining whether high speed operation of the actuator departs from an allowable range based on an actuator position change rate ΔMP and the follow-up difference DM, wherein the controlling device controls a rotation of the actuator by outputting the manipulation variable MV to the actuator; and wherein the actuator rotates to a rotation angle position in accordance with the manipulation variable MV outputted from the controlling device.

10. The method according to claim 9, wherein
the allowable range determining step determines that an abnormality occurs in the actuator when an absolute value |ΔMP| of the actuator position change rate ΔMP is less than DPH−α and an absolute value |DM| of the follow-up difference DM is larger than DPH, wherein DPH is a value corresponding to an absolute value of a maximum position change rate of the actuator and α is a predefined value.

11. The method according to claim 10, wherein the actuator includes a motor.

12. The method according to claim 10 further comprising the steps of:
calculating the manipulation variable MV based on a setting value SP and a controlled variable PV; and
outputting the manipulation variable MV to an operating portion of an actuator.

13. A method for detecting a fault of an actuator driven according to a manipulation variable (MV) output from a controlling device, comprising the steps of:
acquiring a value of an actuator position (MP) from a position detection and feedback mechanism of the actuator that detects a position of the actuator corresponding to the manipulation variable MV;

calculating a follow-up difference (DM=MV−MP); and determining whether low speed operation of the actuator departs from an allowable range based on a manipulation variable change rate ΔMV, an actuator position change rate ΔMP, and the follow-up difference DM, wherein the controlling device controls a rotation of the actuator by outputting the manipulation variable MV to the actuator; and wherein the actuator rotates to a rotation angle position in accordance with the manipulation variable MV outputted from the controlling device.

14. The method according to claim 13, wherein
the allowable range determining step determines that an abnormality occurs in the actuator when an absolute value |ΔMP| of the actuator position change rate ΔMP is less than |ΔMV(t0)|−β, the follow-up difference DM is substantially 0, and |ΔMV(t1)| is less than DPH, wherein DPH is a value corresponding to an absolute value of a maximum position change rate of the actuator, β is a predefined value, |ΔMV(t0)| is an absolute value of the manipulation variable change rate at time t0 and |ΔMV(t1)| is an absolute value of the manipulation variable change rate at time t1.

15. The method according to claim 14, wherein the actuator includes a motor.

16. The method according to claim 14 further comprising the steps of:
calculating the manipulation variable MV based on a setting value SP and a controlled variable PV; and
outputting the manipulation variable MV to an operating portion of an actuator.

* * * * *